United States Patent
Chang et al.

(10) Patent No.: US 8,169,206 B2
(45) Date of Patent: May 1, 2012

(54) DUTY FEED FORWARD METHOD AND APPARATUS FOR MODULATING DUTY CYCLE OF PMW SIGNAL AND POWER CONVERTING METHOD AND POWER CONVERTER USING THE SAME

(75) Inventors: Tsai-Fu Chang, Taichung (TW);
Liang-Pin Tai, Tainan (TW)

(73) Assignee: Richtek Technology Corp., Hsinchu (TW)

( * ) Notice: Subject to any disclaimer, the term of this patent is extended or adjusted under 35 U.S.C. 154(b) by 0 days.

(21) Appl. No.: 12/960,714

(22) Filed: Dec. 6, 2010

(65) Prior Publication Data
US 2011/0068763 A1    Mar. 24, 2011

Related U.S. Application Data

(62) Division of application No. 11/849,629, filed on Sep. 4, 2007.

(30) Foreign Application Priority Data

Sep. 7, 2006 (TW) ............................... 95133107 A (51) Int. Cl.
*G05F 1/40* (2006.01)
(52) U.S. Cl. .................................. 323/284; 323/288
(58) Field of Classification Search .................. 323/282, 323/284, 285, 288; 327/133, 134; 375/238
See application file for complete search history.

(56) References Cited

U.S. PATENT DOCUMENTS

| | | | | |
|---|---|---|---|---|
| 3,737,640 A | * | 6/1973 | Pao et al. | 708/843 |
| 5,642,267 A | * | 6/1997 | Brkovic et al. | 363/16 |
| 7,106,130 B2 | * | 9/2006 | Gan et al. | 330/10 |
| 7,746,926 B2 | * | 6/2010 | Chu et al. | 375/238 |

* cited by examiner

*Primary Examiner* — Jessica Han
(74) *Attorney, Agent, or Firm* — Rosenberg, Klein & Lee (57) ABSTRACT

The duty of a PWM signal in a power converter is extracted to feed forward to modulate the slope of a linear oscillating ramp signal or the voltage level of an error signal, so as to modulate the duty of the PWM signal, by which the transient response of the power converter and the stability of the PWM loop both are improved.

20 Claims, 8 Drawing Sheets

DUTY FEED FORWARD METHOD AND APPARATUS FOR MODULATING DUTY CYCLE OF PMW SIGNAL AND POWER CONVERTING METHOD AND POWER CONVERTER USING THE SAME

RELATED APPLICATIONS

This application is a Divisional patent application of application Ser. No. 11/849,629, filed on 4 Sep. 2007. The entire disclosure of the prior application Ser. No. 11/849,629, from which an oath or declaration is supplied, is considered a part of the disclosure of the accompanying Divisional application and is hereby incorporated by reference.

FIELD OF THE INVENTION

The present invention is related generally to power supplies and, more particularly, to a duty feed forward method and apparatus for modulating a duty of a pulse width modulation (PWM) signal in a power converter.

BACKGROUND OF THE INVENTION

Figure 1:
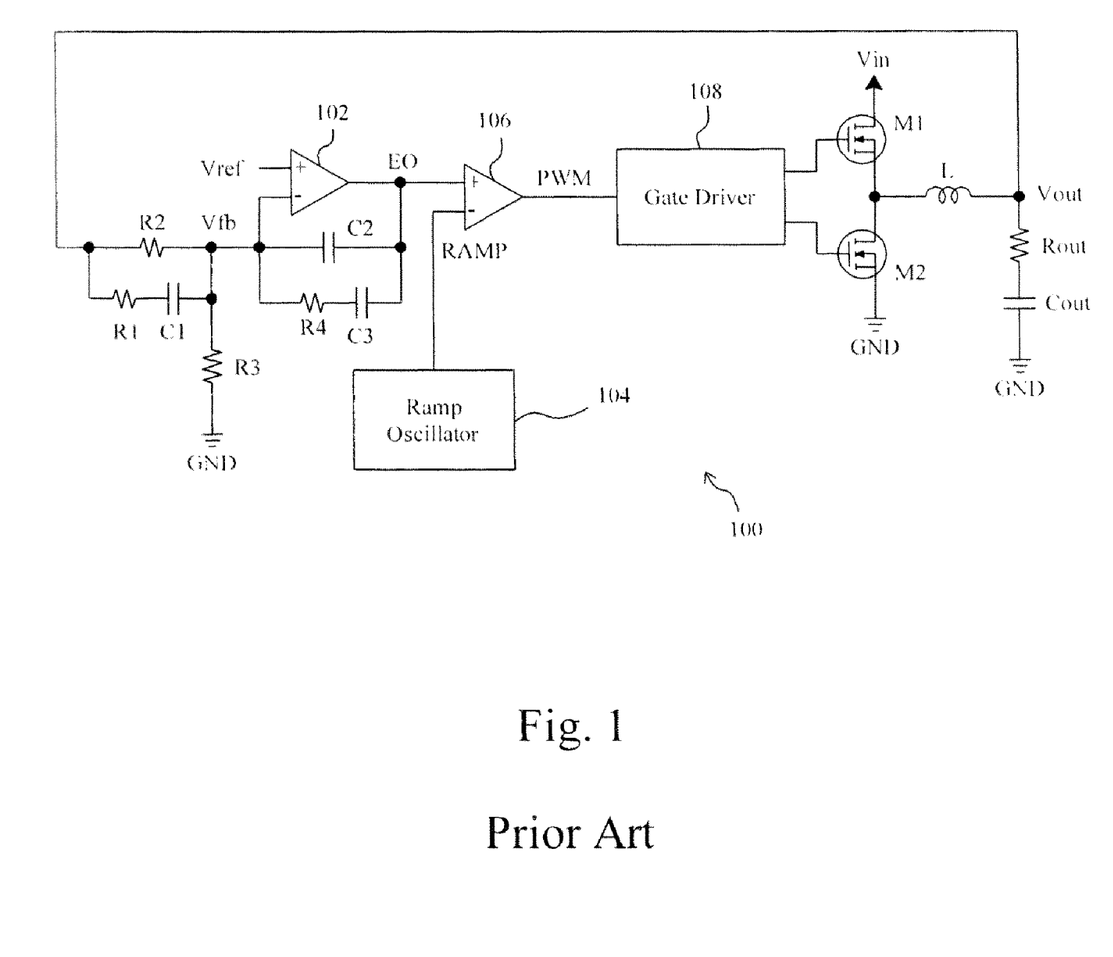
FIG. 1 shows a conventional PWM power converter.

As shown in FIG. 1, in a typical PWM power converter 100, an error amplifier 102 compares a feedback signal Vfb derived from an output voltage Vout with a reference signal Vref to produce an error signal EO, a PWM modulator 106 compares the error signal EO with a constant slope linear oscillating ramp signal RAMP provided by a ramp generator 104 to produce a PWM signal, the PWM signal switches two transistors M1 and M2 with a gate driver 108, and the duty of the PWM signal determines the ON time and OFF time of the transistors M1 and M2, so as to regulate the output voltage Vout. The ratio of the supply voltage Vin to the amplitude of the ramp signal RAMP, i.e. Vin/Vramp, is called modulation gain of the PWM loop, and is closely related to the response speed and the stability of the PWM loop. Besides; the loop gain of the power converter 100 is proportional to the product of the feedback factor of a compensation circuit composed of resistors R1, R2, R3 and R4 and capacitors C1, C2 and C3, the gain of the error amplifier 102, and the modulation gain, i.e. (Vref/Vout)×(Vin/Vramp), so the modulation gain also influences the transient response of the power converter 100.

Figure 2:
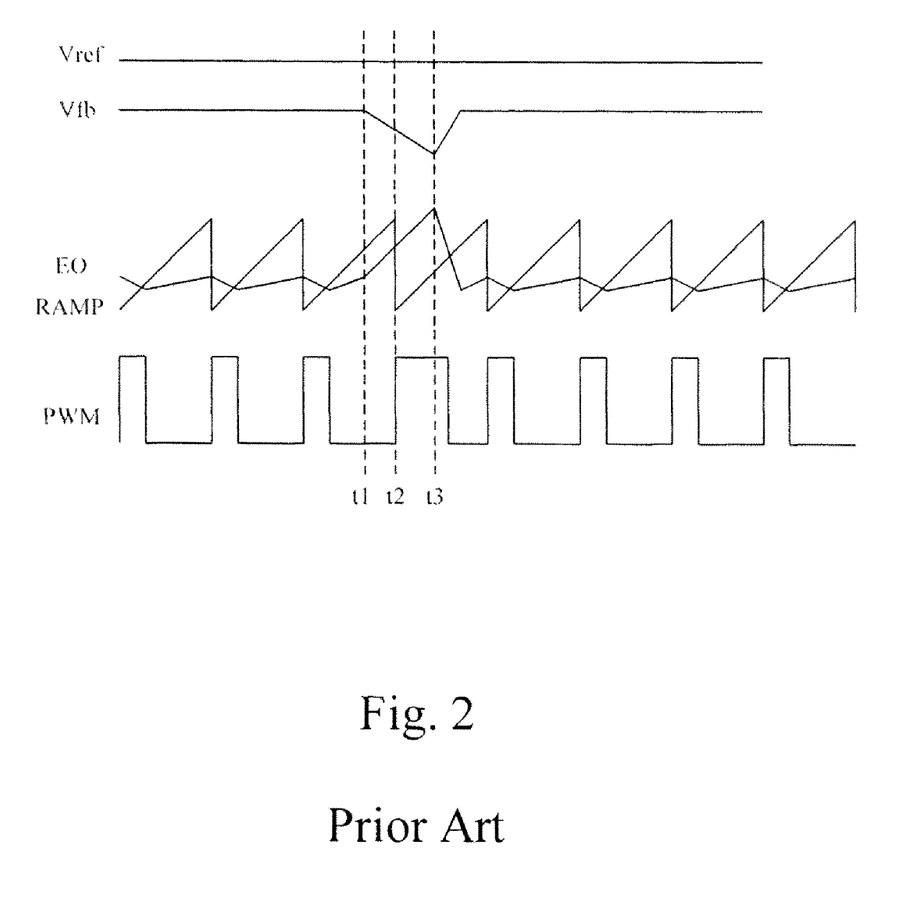
FIG. 2 shows various signals in the circuit of FIG. 1.

FIG. 2 shows various signals in the circuit of FIG. 1. At time t1, the feedback signal Vfb drops down due to some reasons such as a sudden decrease of the input voltage Vin and a decrease of the output voltage Vout caused by a rapid current draining by the load, and causes the difference between the feedback signal Vfb and the reference voltage Vref lager, so the error signal EO rises up obviously after time t1. At time t2, the error signal EO keeps increasing and becomes higher than the ramp signal RAMP, so the PWM signal changes from low to high. When the PWM signal is high, the transistor M1 is on while the transistor M2 is off, so the output Vout is charged by the power source Vin. At time t3, the feedback signal Vfb rises up again toward the original level with the increasing output voltage Vout. This waveform diagram substantially shows the process of the transient response of the power converter 100.

Several arts have been proposed to improve the stability of the modulation gain. U.S. Pat. No. 6,522,115 to Greitschus provides a non-linear ramp signal to replace the linear ramp signal for the comparator; however, it requires one more pin for the controller chip to monitor the inductor current, and the PWM loop is more difficult to design and modify. U.S. Pat. No. 6,593,725 to Gallagher et al. proposes a pulse generator to control the ramp signal and the PWM signal, but it needs to monitor the supply voltage and has complex circuit. U.S. Pat. No. 6,049,473 to Jang et al. not only controls a non-linear ramp generator by the PWM signal, but also monitors the supply voltage.

Therefore, it is desired a method and apparatus without monitoring the supply voltage in order to improve the stability and response speed of the PWM loop.

SUMMARY OF THE INVENTION

An object of the present invention is to provide a method and apparatus for producing a PWM signal.

Another object of the present invention is to provide a power converting method and power converter.

Yet another object of the present invention is to provide a method and apparatus to improve the transient response of a PWM power converter.

Still another object of the present invention is to provide a method and apparatus to improve the stability of a PWM loop.

Yet still another object of the present invention is to provide a method and apparatus to achieve the forgoing objects without monitoring the supply voltage.

A method according to the present invention comprises extracting a duty information from a PWM signal to modulate the voltage level of an error signal or the slope of a linear oscillating ramp signal, and comparing the error signal with the linear oscillating ramp signal to produce the PWM signal, so as to modulate the duty of the PWM signal.

An apparatus according to the present invention comprises a first circuit for comparing an error signal with a linear oscillating ramp signal to produce a PWM signal, and a second circuit for extracting a duty information from the PWM signal to modulate the voltage level of the error signal or the slope of the linear oscillating ramp signal, so as to modulate the duty of the PWM signal.

A power converting method according to the present invention comprises comparing an output voltage dependent feedback signal with a reference signal to produce an error signal, comparing the error signal with a linear oscillating ramp signal to produce a PWM signal, modulating the voltage level of the error signal or the slope of the linear oscillating ramp signal depending on a duty information from the PWM signal, and driving a switching circuit with the PWM signal to convert a supply voltage to an output voltage.

A power converter according to the present invention comprises an error amplifier for comparing an output voltage dependent feedback signal with a reference signal to produce an error signal, a PWM modulator for comparing the error signal with a linear oscillating ramp signal to produce a PWM signal, a feed forward circuit for producing a feed forward signal to provide a duty information for the PWM modulator to modulate the duty of the PWM signal, and a switching circuit driven by the PWM signal for converting a supply voltage to an output voltage.

Because the slope of the linear oscillating ramp signal or the voltage level of the error signal changes with the duty of the PWM signal, the stability and the response speed of the PWM loop, and the transient response of the power converter are improved.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 3:
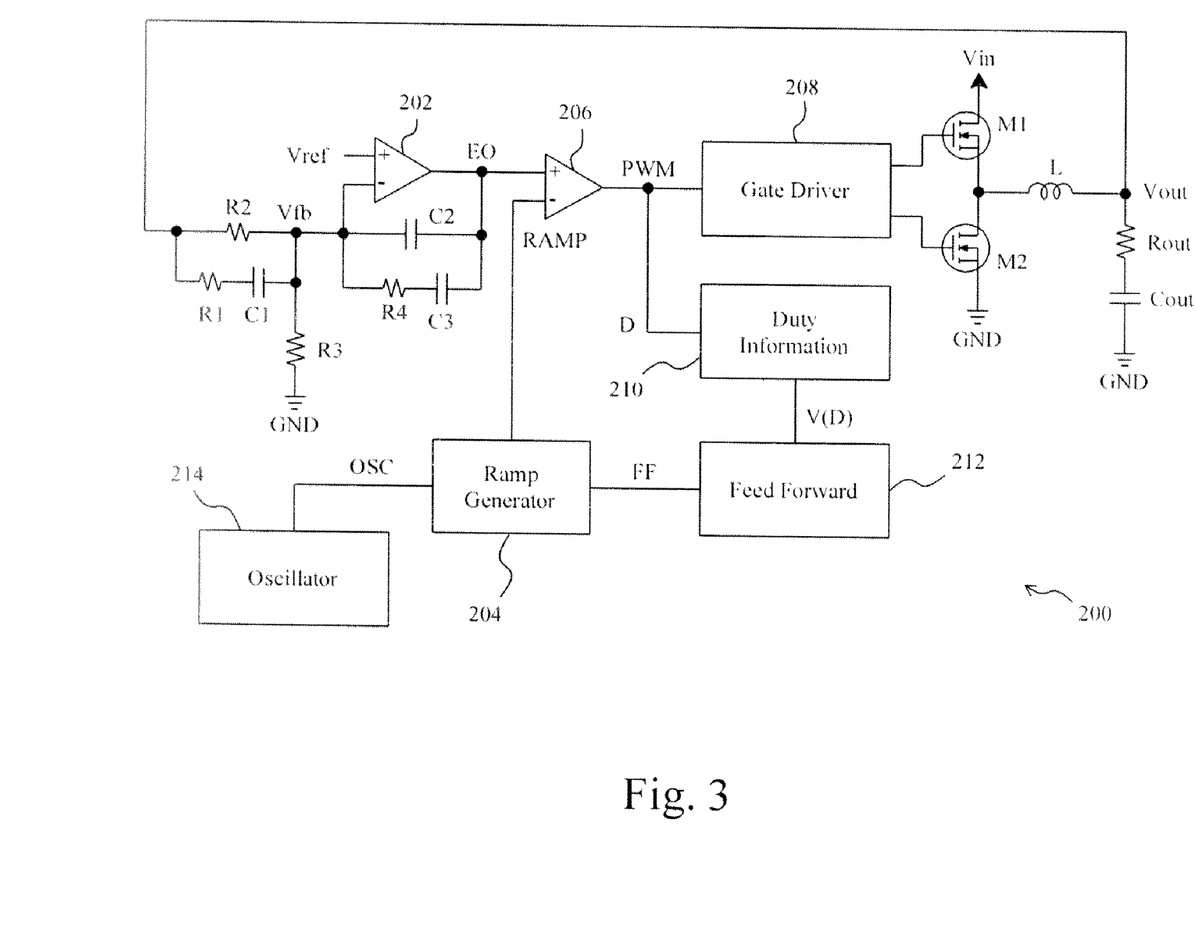
FIG. 3 shows an embodiment according to the present invention.

FIG. 3 shows an embodiment according to the present invention, in which the PWM power converter 200 is similar to the conventional PWM power converter 100 of FIG. 1. The difference is that the PWM power converter 200 has a duty information circuit 210 to extract a duty information from the PWM signal and transform the duty D of the PWM signal to a linearly dependent voltage V(D), a feed forward circuit 212 to transform the voltage V(D) to a feed forward signal FF, and a ramp generator 204 to produce a linear oscillating ramp signal RAMP for the PWM comparator 206 according to an oscillator signal OSC provided by an oscillator 214 and the feed forward signal FF. In this embodiment, the slope of the linear oscillating ramp signal RAMP is modulated by the feed forward signal FF, namely, the duty D of the PWM signal, and hence the slope of the linear oscillating ramp signal RAMP will change with the duty D of the PWM signal.

Because the slope of the linear oscillating ramp signal RAMP is modulated by the duty D which is directly extracted from the PWM signal, the transient response of the PWM power converter 200 is improved. Besides, because the slope of the linear oscillating ramp signal RAMP can be changed, the modulation gain can be changed accordingly. When the duty D decreases with the decrease of the output voltage Vout, the slope of the linear oscillating ramp signal RAMP is increased to decrease the modulation gain, and hence improve the stability. Specifically, the foregoing control process does not need to monitor the supply voltage Vin.

Figure 4:
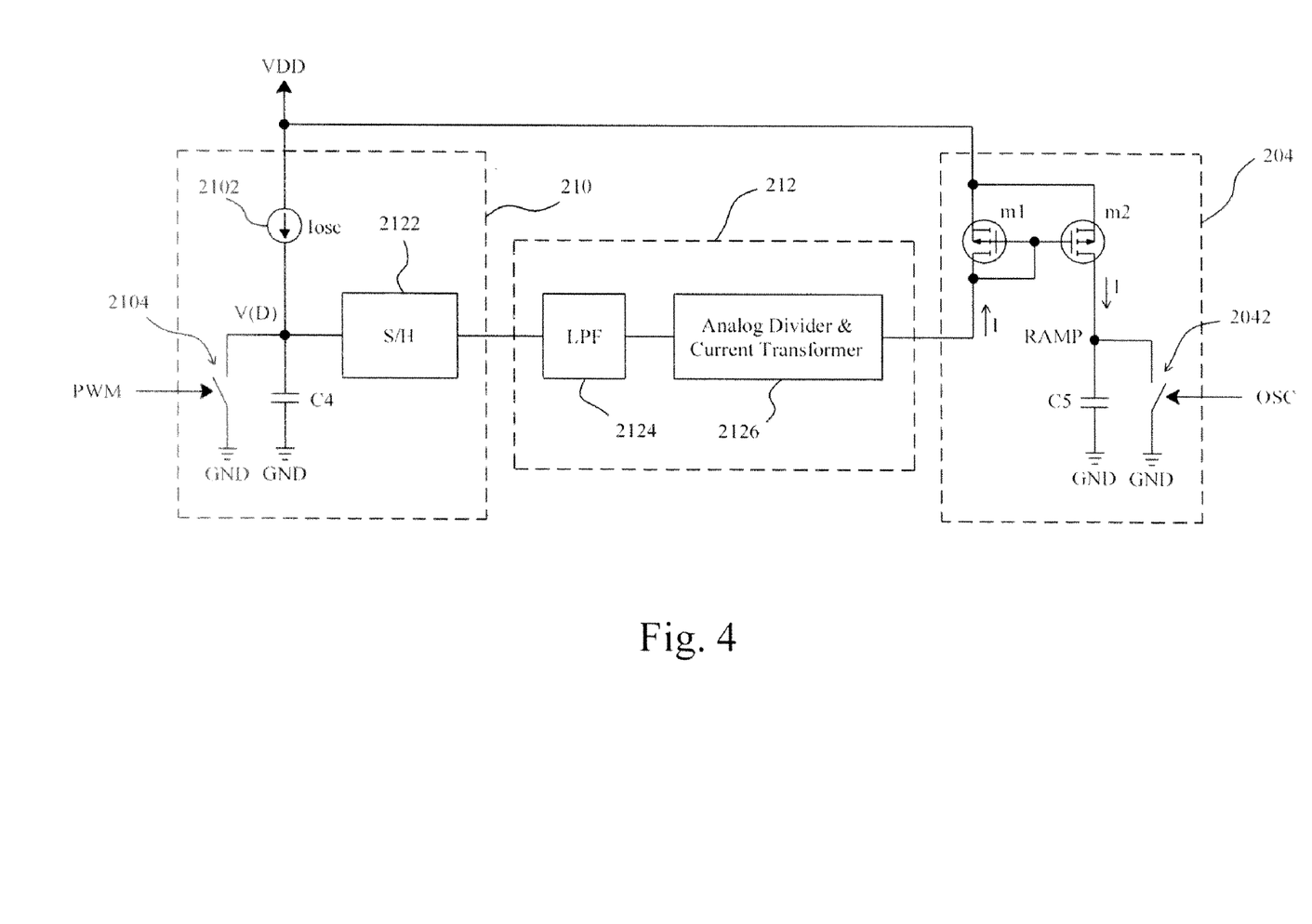
FIG. 4 shows an embodiment for the PWM power converter of FIG. 3.

FIG. 4 shows an embodiment for the duty information circuit 210, the feed forward circuit 212, and the ramp generator 204 of FIG. 3. In the duty information circuit 210, a current source 2102 provides a charging current Iosc, a switch 2104 is switched by the PWM signal to charge the capacitor C4 with the charging current Iosc to produce the voltage V(D), and a sample and hold circuit 2122 samples the voltage V(D) to produce a sampled voltage for the feed forward circuit 212. The sampled voltage from the duty information circuit 210 is filtered out its noises by a low pass filter (LPF) 2124, and an analog divider and current transformer 2126 divides the filtered voltage by a constant and transforms that into a current I. In this embodiment, the feed forward signal FF is the current I. In the ramp generator 204, two transistors m1 and m2 form a current mirror to mirror the current I to charge a capacitor C5, and a switch 2042 is switched by the oscillator signal OSC of the oscillator 214, such that the capacitor C5 produces the linear oscillating ramp signal RAMP. Briefly, a greater duty D of the PWM signal results in a longer charging time for the capacitor C4, and so produces a higher voltage V(D); a higher voltage V(D) results in a lower current I, and so causes the capacitor C5 to be charged slower, i.e., the slope of the linear oscillating ramp signal. RAMP becomes smaller.

In further detail, let t represent the rising time of the linear oscillating ramp signal RAMP, and T represent the switching period of the PWM signal. As mentioned in the foregoing description, the duty D of the PWM signal is equal to Vout/Vin, and therefore $$t = D \times T.  \quad \text{[Eq-1]}$$

The current Iosc charges the capacitor C4 to produce the voltage $$\begin{aligned} V(D) &= (Iosc/C4) \times t \\ &= (Iosc/C4) \times D \times T, \end{aligned} \quad \text{[Eq-2]}$$

which shows that the voltage V(D) is linearly dependent on the duty D. Then, by the analog divider and current transformer 2126, the voltage V(D) is divided by a constant A and transformed into the current $$\begin{aligned} I &= 1/(V(D)/A) \\ &= C4 \times A / Iosc \times D \times T \\ &= f1(D), \end{aligned} \quad \text{[Eq-3]}$$

which shows that the current I is inversely proportion to the voltage V(D) and is a function of the duty D. By charging the capacitor C5 with the current I, the linear oscillating ramp signal RAMP has the amplitude $$\begin{aligned} Vramp &= (I/C5) \times T \\ &= (C4 \times A \times T)/(Iosc \times D \times T \times C5) \\ &= (C4 \times A)/(Iosc \times D \times C5) = f2(D) \\ &= (C4 \times A \times Vin)/(Iosc \times C5 \times Vout), \end{aligned} \quad \text{[Eq-4]}$$

which shows that Vramp is also a function of the duty D. Since the frequency of the linear oscillating ramp signal RAMP is determined by the oscillator 214, the slop of the linear oscillating ramp signal RAMP is also inversely proportional to the duty D. Hence, the modulation gain is $$Vin/Vramp{-}(Iosc{\times}C5{\times}Vout)/(C4{\times}A) \quad \text{[Eq-5]}$$

If the output voltage Vout is constant, the modulation gain is constant too. In addition, the loop gain is proportional to $$(Vin/Vramp){\times}(Vref/Vout){-}(Iosc{\times}C5{\times}Vref)/(C4{\times}A), \quad \text{[Eq-6]}$$

and is therefore a constant, independent on the supply voltage Vin and the output voltage Vout.

Alternatively, depending on the duty D, the duty information circuit 210 may change the charging current Iosc, instead of the charging time, so as to produce the voltage V(D) linearly dependent on the duty D. In another embodiment, the feed forward circuit 212 may employ an integrator or other circuits, instead of analog divider, to produce the current I as a function of the duty D.

Figure 5:
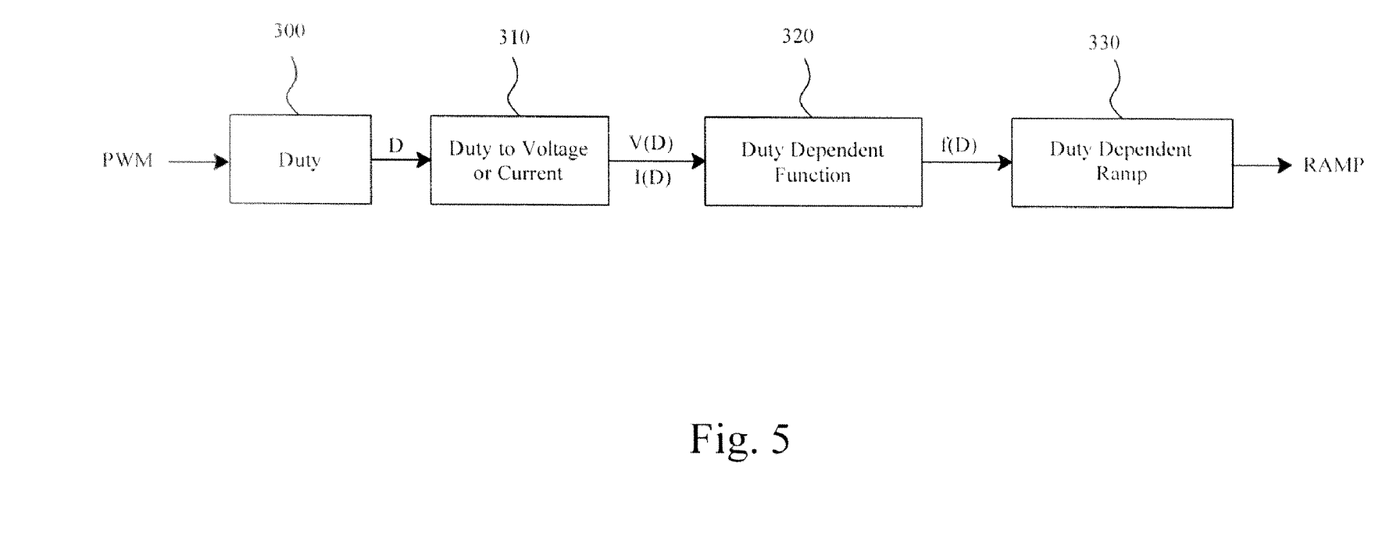
FIG. 5 is a flow chart according to the present invention for the process of modulating the duty of a PWM signal.

The circuit of FIG. 4 is a preferred embodiment of producing the linear oscillating ramp signal RAMP, and FIG. 5 provides a general process of producing the linear oscillating ramp signal RAMP from the duty D of the PWM signal. At step 300, a duty information is extracted from the PWM signal to provide the duty D. At step 310, the duty D is transformed into a voltage V(D) or a current I(D) whose value is determined by the duty D. At step 320, the voltage V(D) or the current I(D) is transformed into a duty dependent function f(D), such as linear function, piecewise linear function, logarithm function, exponential function, power function, trigonometric function, and any other non-linear function of the duty D. At step 330, the linear oscillating ramp signal RAMP is produced according to the function f(D), such that the slope of the linear oscillating ramp signal RAMP is determined by the value of the function f(D). In another embodiment, it may directly determine the slope of the linear oscillating ramp signal RAMP from the duty D, without the transform process shown in FIG. 5.

Figure 6:
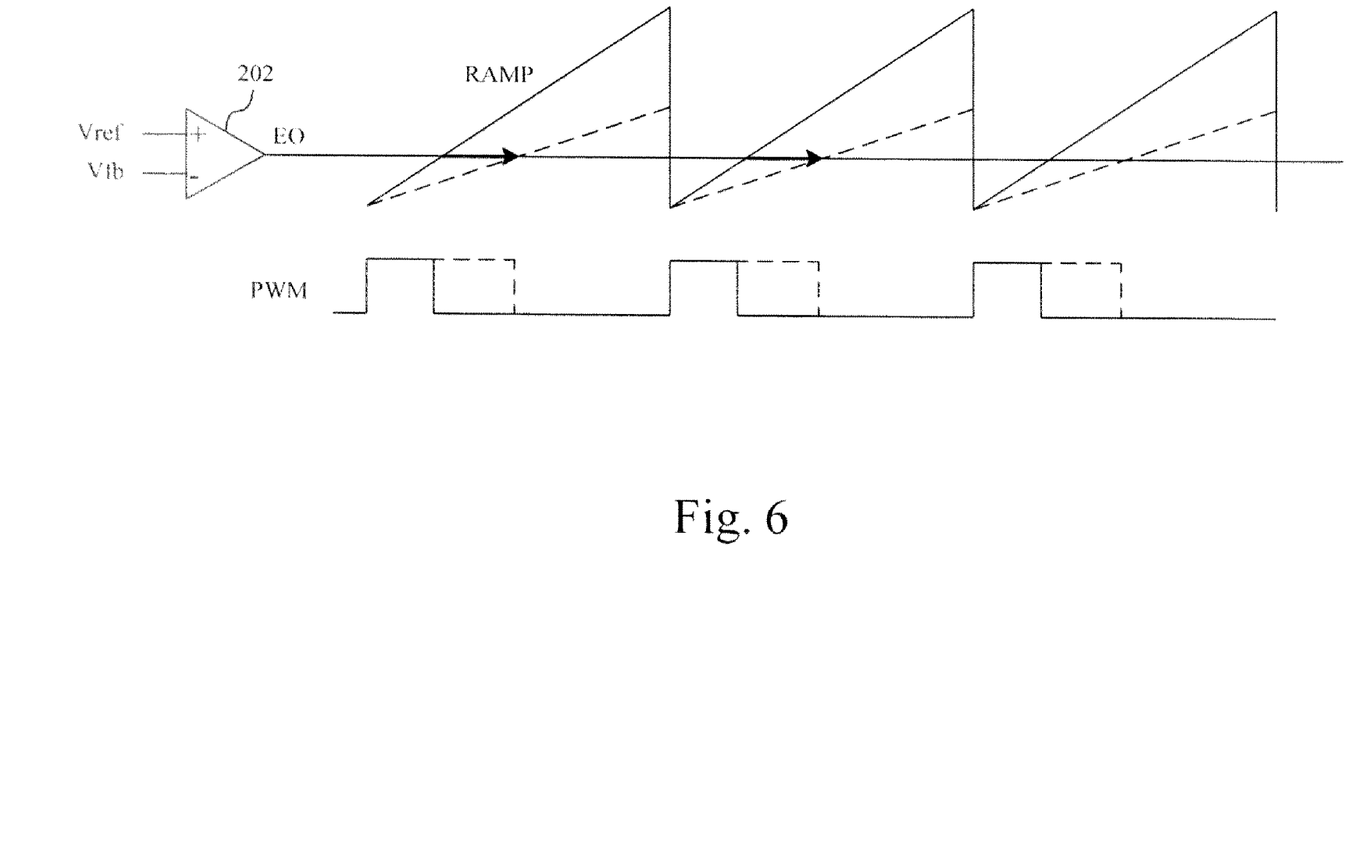
FIG. 6 shows how the duty of a PWM signal is changed by changing the slope of the linear oscillating ramp signal RAMP.

FIG. 6 shows how the duty D of the PWM signal is changed by changing the slope of the linear oscillating ramp signal RAMP. When the supply voltage Vin becomes higher or the output voltage Vout becomes lower, the slope of the linear oscillating ramp signal RAMP becomes steeper, and therefore the error signal EO and the linear oscillating ramp signal RAMP will approach each other faster, which causes them to cross with each other earlier, and so the PWM signal changes earlier from high to low, in other words, the duty D becomes smaller. On the contrary, when the slope of the linear oscillating ramp signal RAMP becomes smaller because the supply voltage Vin decreases or the output voltage Vout increases, as shown by the dash line of FIG. 6, the error signal EO and the linear oscillating ramp signal RAMP will approach each other slower, which causes them to cross with each other later, and therefore, the PWM signal changes later from high to low, in other words, the duty D is greater. In steady state, the error signal EO will keep stable.

Figure 7:
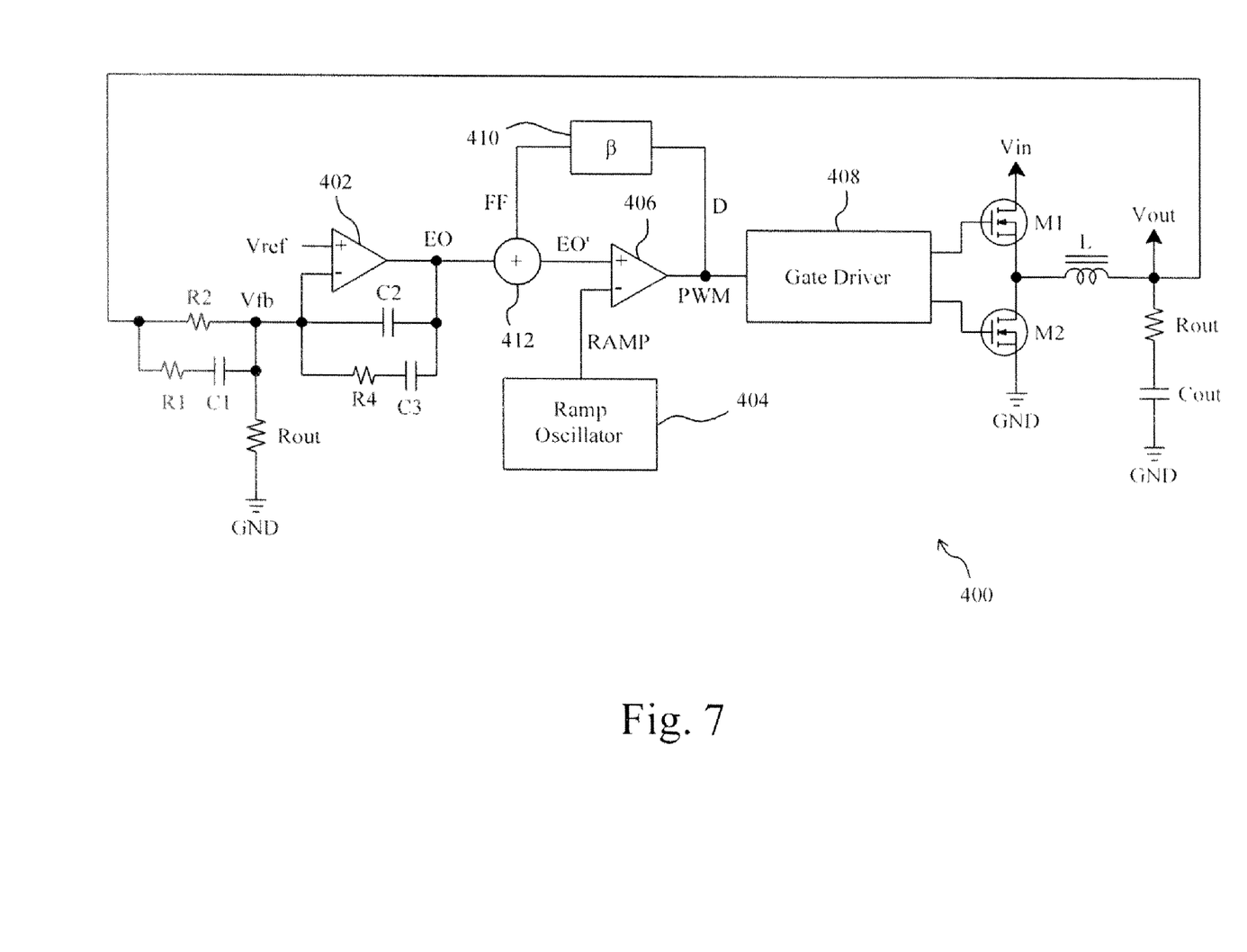
FIG. 7 shows another embodiment according to the present invention.

In the above embodiments, the duty D of the PWM signal is modulated by modulating the slope of the linear oscillating ramp signal RAMP. One skilled in the art should know that it could be replaced by feeding forward the duty D to modulate the voltage level of the error signal EO to achieve the same effect, and FIG. 7 provides such an embodiment. In a PWM power converter 400, a circuit 410 extracts a duty information from the PWM signal and produces a feed forward signal FF to combine with the error signal EO, so as to modulate the voltage level of the error signal EO, and therefore to modulate the duty D of the PWM signal. In one embodiment, the feed forward signal FF is a product of the duty D and a modulation coefficient and a combiner 412 subtracts the feed forward signal FF from the error signal EO to produce a modulated error signal $$EO'=EO-FF=EO-\beta \times D. \quad [Eq\text{-}7]$$

The modulated error signal EO' is thus changed with the duty D. Then, a PWM modulator 406 compares the modulated error signal EO' with a constant slope linear oscillating ramp signal RAMP to produce the PWM signal. The modulated error signal EO' equals to the product of the amplitude Vramp of the linear oscillating ramp signal RAMP and the duty D, that is $$EO'=Vramp \times D. \quad [Eq\text{-}8]$$

From the equations Eq-7 and Eq-8, it may have the error signal $$EO = Vramp \times D + \beta \times D \quad [Eq\text{-}9]$$

$$= (Vramp + \beta) \times D$$

$$= (Vramp + \beta) \times (Vout/Vin).$$

Besides, the modulation gain Vin/Vramp equals Vout/EO, so it can conduct the modulation gain from the equation Eq-9

$$Vout/EO = Vout/((Vramp+\beta) \times (Vout/Vin)) \quad [Eq\text{-}10]$$

$$= Vin/(Vramp+\beta).$$

Let Vramp+β be proportional to 1/D, i.e.

$$Vramp+\beta = \alpha(1/D), \quad [Eq\text{-}11]$$

where α is a constant. From the equations Eq-10 and Eq-11, the modulation gain will be $$Vout/EO = Vin/(Vramp+\beta) \quad [Eq\text{-}12]$$

$$= Vin \times D/\alpha$$

$$= Vout/\alpha.$$

Therefore, if the output voltage Vout is constant, the modulation gain is constant too. In addition, the loop gain is proportional to $$(Vin/Vramp) \times (Vref/Vout) = (Vout/EO) \times (Vref/Vout) \quad [Eq\text{-}13]$$

$$= (Vin \times D/\alpha) \times (Vref/Vout)$$

$$= D \times (Vin/Vout) \times (Vref/\alpha)$$

$$= Vref/\alpha,$$

and is thus a constant, independent on the supply voltage Vin and the output voltage Vout. From the equation Eq-11, it may conduct the modulation coefficient $$\beta = \alpha(1/D) - Vramp \quad [Eq\text{-}14]$$

Figure 8:
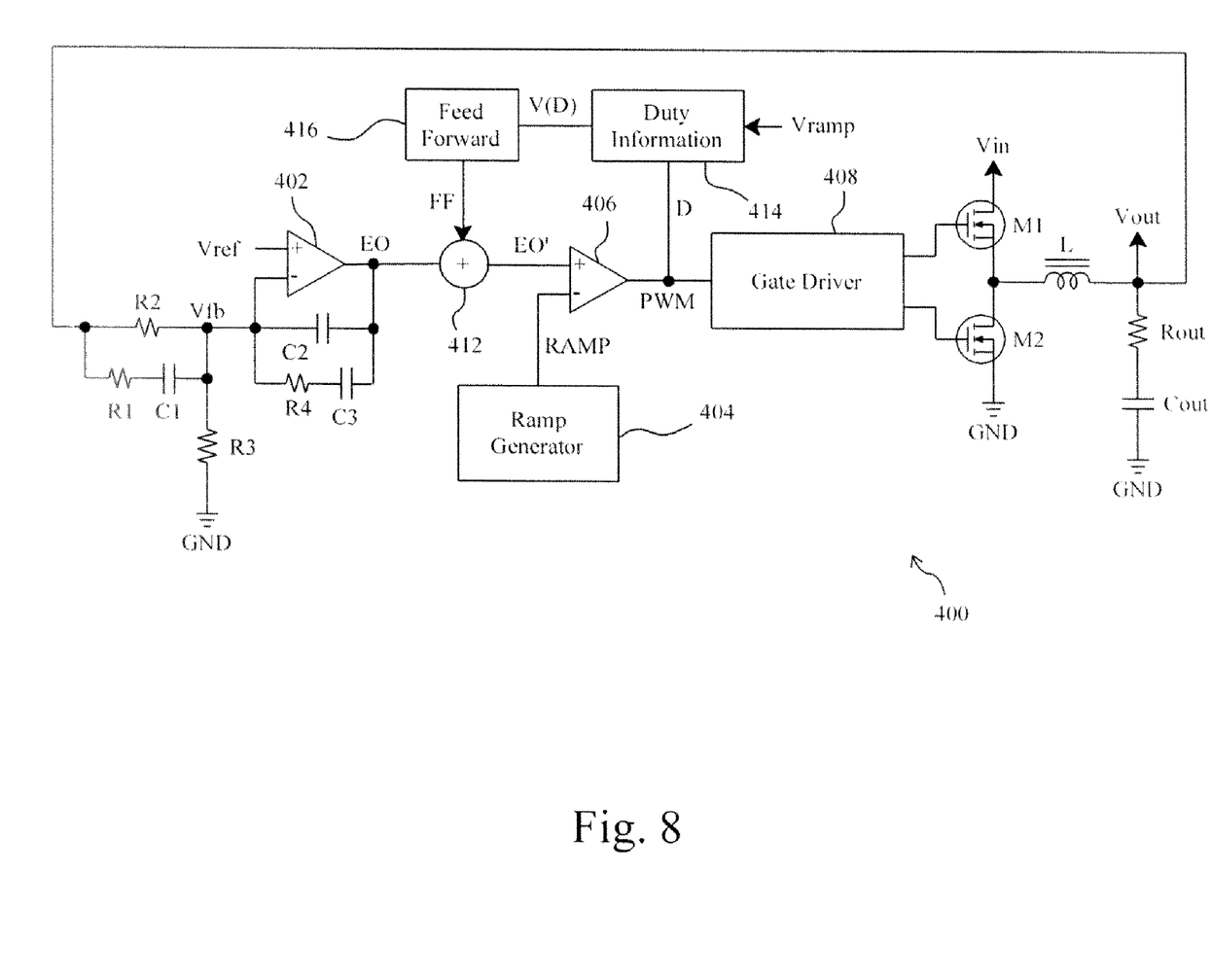
FIG. 8 shows an embodiment of the PWM power converter of FIG. 7.

FIG. 8 shows an embodiment for the circuit 410 of FIG. 7. In this embodiment, a duty information circuit 414 transforms the duty D of the PWM signal into a linearly dependent voltage V(D), and a feed forward circuit 416 produces the feed forward signal FF according to the operation of the voltage V(D) and the amplitude Vramp of the linear oscillating ramp signal RAMP. In another embodiment, the feed forward signal FF may be produced according to a linear function, a piecewise linear function, a logarithm function, an exponential function, a power function, a trigonometric function, or any other non-linear function of the duty D.

As known by one skilled in the art, it may combine the feed forward signal FF with the reference signal Vref or the feedback signal Vfb alternatively, in order to modulate the error signal EO. Therefore, only by modifying some parts of the circuit of FIG. 7 or FIG. 8, it may have the same effect as illustrated by the foregoing embodiments.

As shown in the above embodiments, direct extracting of the duty information from the PWM signal to produce a feed forward signal to modulate the input of the PWM comparator can speed up the transient response of the PWM power converter and improve the stability of the PWM loop.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A duty feed forward method for modulating a duty of a PWM signal for a power converter, comprising the steps of:
   comparatively evaluating an output of the power converter and a reference value to generate an error signal, the power converter output being regulated responsive to the PWM signal;
   extracting a duty information from the PWM signal and feeding to the error signal;
   modulating the error signal depending on the duty information; and
   comparing the error signal with a linear oscillating ramp signal for producing the PWM signal, a transient response to fluctuation of the power converter output being thereby accelerated responsive to the error signal modulation.

2. The duty feed forward method of claim 1, wherein the step of modulating an error signal depending on the duty information comprises the step of producing a feed forward signal which is a function of the duty.

3. The duty feed forward method of claim 2, wherein the function comprises a linear function, a piecewise linear function, a logarithm function, an exponential function, a power function, a trigonometric function, or any other non-linear function.

4. The duty feed forward method of claim 2, wherein the feed forward signal is substantially a product of the duty and a modulation coefficient.

5. The duty feed forward method of claim 1, wherein the step of modulating the error signal depending on the duty information comprises the step of modulating a voltage level of the error signal.

6. The duty feed forward method of claim 1, wherein the error signal has a voltage level which is a function of the duty.

7. A duty feed forward apparatus for modulating a duty of a PWM signal for a power converter, comprising:
   an error generation circuit comparatively evaluating an output of the power converter and a reference value to generate an error signal, the power converter output being regulated responsive to the PWM signal;
   a first circuit for comparing the error signal with a linear oscillating ramp signal to produce the PWM signal; and
   a second circuit for extracting a duty information from the PWM signal and feeding to the first circuit to modulate the error signal, a transient response to fluctuation of the power converter output being thereby accelerated responsive to the error signal modulation.

8. The duty feed forward apparatus of claim 7, wherein the second circuit produces a feed forward signal which is a function of the duty.

9. The duty feed forward apparatus of claim 8, wherein the error signal has a voltage level modulated by the feed forward signal.

10. The duty feed forward apparatus of claim 9, wherein the second circuit comprises:
    a first transform circuit for transforming the duty into a voltage; and
    a second transform circuit for producing the feed forward signal from the voltage.

11. The duty feed forward apparatus of claim 9, wherein the feed forward signal is substantially a product of the duty and a modulation coefficient.

12. A power converting method for producing an output voltage, comprising the steps of:
    producing a feedback signal which is related to the output voltage of the power conversion;
    comparing the feedback signal with a reference signal for producing an error signal;
    comparing the error signal with a linear oscillating ramp signal for producing a PWM signal to regulate the output voltage;
    extracting a duty information from the PWM signal and feeding to the error signal;
    modulating the error signal depending on the duty information for modulating a duty of the PWM signal, a transient response to fluctuation of the output voltage being thereby accelerated responsive to the error signal modulation; and
    driving a switching circuit with the PWM signal for converting a supply voltage to the output voltage.

13. The power converting method of claim 12, wherein the step of extracting a duty information from the PWM signal comprises the step of producing a feed forward signal which is a function of the duty.

14. The power converting method of claim 13, wherein the feed forward signal is substantially a product of the duty and a modulation coefficient.

15. The power converting method of claim 12, wherein the step of modulating the error signal depending on the duty information comprises the step of modulating a voltage level of the error signal.

16. A power converter for producing an output voltage, comprising:
    a feedback circuit for producing a feedback signal which is related to the output voltage;
    an error amplifier for comparing the feedback signal with a reference signal to produce an error signal;
    a PWM modulator for comparing the error signal with a linear oscillating ramp signal to produce a PWM signal having a duty to regulate the output voltage;
    a duty feed forward circuit for producing a feed forward signal from the PWM signal feeding to the error signal to modulate the error signal, wherein the feed forward signal is a function of the duty, a transient response to fluctuation of the output voltage being thereby accelerated responsive to the error signal modulation; and
    a switching circuit for being driven by the PWM signal to convert a supply voltage to the output voltage.

17. The power converter of claim 16, further comprising a combiner for subtracting the feed forward signal from the error signal, so as to modulate a voltage level of the error signal.

18. The power converter of claim 17, wherein the feed forward signal is substantially a product of the duty and a modulation coefficient.

19. The power converter of claim 16, wherein the error signal is modulated such that the power converter has a constant modulation gain.

20. The power converter of claim 16, wherein the error signal is modulated such that the power converter has a constant loop gain.

\* \* \* \* \*